US010725115B2

(12) United States Patent
Chang et al.

(10) Patent No.: US 10,725,115 B2
(45) Date of Patent: Jul. 28, 2020

(54) METHODS AND APPARATUS FOR DETECTING ELECTRICAL LEAKAGE IN A VEHICLE

(71) Applicant: FORD GLOBAL TECHNOLOGIES, LLC, Dearborn, MI (US)

(72) Inventors: Xiaoguang Chang, Northville, MI (US); Xu Wang, Dearborn, MI (US); Chuan He, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1144 days.

(21) Appl. No.: 14/515,999

(22) Filed: Oct. 16, 2014

(65) Prior Publication Data

US 2016/0109500 A1   Apr. 21, 2016

(51) Int. Cl.
*G01R 31/50* (2020.01)
*G01R 31/00* (2006.01)

(52) U.S. Cl.
CPC ............ *G01R 31/50* (2020.01); *G01R 31/006* (2013.01)

(58) Field of Classification Search
CPC .............................. G01R 31/025; G01R 27/18
USPC ........................................................ 324/509
See application file for complete search history.

(56) References Cited

U.S. PATENT DOCUMENTS

| 5,382,946 | A | * | 1/1995 | Gale | ..................... G01R 31/006 324/510 |
| 5,760,587 | A | | 6/1998 | Harvey | |
| 6,998,819 | B2 | | 2/2006 | Jin | |
| 7,102,356 | B2 | | 9/2006 | Wild | |
| 7,459,914 | B2 | * | 12/2008 | Lindsey | ................ B60L 3/0023 324/522 |
| 7,791,218 | B2 | * | 9/2010 | Mekky | .................... E05B 77/02 307/10.1 |
| 7,952,327 | B2 | * | 5/2011 | Kudo | ................... G01R 31/025 320/116 |
| 8,004,284 | B2 | * | 8/2011 | Kamata | ................ G01R 31/025 324/509 |
| 8,319,650 | B2 | | 11/2012 | Volodymyr et al. | |
| 8,427,167 | B2 | | 4/2013 | Streit | |
| 9,156,370 | B1 | * | 10/2015 | Enomoto | ............ B60L 11/1861 |
| 2004/0243288 | A1 | * | 12/2004 | Kito | ........................ B60K 6/48 702/183 |
| 2006/0006840 | A1 | * | 1/2006 | Furukawa | ............. H02J 7/0021 320/116 |

(Continued)

FOREIGN PATENT DOCUMENTS

WO        2010029353 A1      3/2010

OTHER PUBLICATIONS

X. Chang, U.S. Appl. No. 14/278,590, filed May 15, 2014, currently pending.

*Primary Examiner* — Dominic E Hawkins
(74) *Attorney, Agent, or Firm* — David B. Kelley; Brooks Kushman P.C.

(57) ABSTRACT

A vehicle includes a battery pack, an electric motor, and a contactor to electrically connect the pack and motor. The contactor is configured with a control circuit to electrically connect the pack and motor. The control circuit includes a leak detection sensor. The vehicle further includes a controller to output a leakage resistance associated with the pack. The leakage resistance is based on a voltage of the pack and a leak voltage detected by the sensor while the contactor is closed.

15 Claims, 4 Drawing Sheets

(56) References Cited

U.S. PATENT DOCUMENTS

| | | | | |
|---|---|---|---|---|
| 2009/0121672 A1* | 5/2009 | Endou | ............... | B60L 3/0023 |
| | | | | 320/104 |
| 2012/0221269 A1 | 8/2012 | Wanner et al. | | |
| 2014/0002021 A1* | 1/2014 | Bertness | ............ | B60L 11/1838 |
| | | | | 320/109 |
| 2014/0008970 A1* | 1/2014 | Yamaguchi | ......... | G01R 31/024 |
| | | | | 307/9.1 |
| 2014/0021961 A1* | 1/2014 | Yamada | ............ | G01R 31/025 |
| | | | | 324/503 |
| 2014/0368211 A1* | 12/2014 | Inoue | ............... | G01R 31/025 |
| | | | | 324/509 |
| 2015/0063582 A1* | 3/2015 | Pan | ..................... | G10K 11/178 |
| | | | | 381/71.4 |
| 2015/0168474 A1* | 6/2015 | Yoshioka | ............ | G01R 31/025 |
| | | | | 702/58 |

\* cited by examiner

METHODS AND APPARATUS FOR DETECTING ELECTRICAL LEAKAGE IN A VEHICLE

TECHNICAL FIELD

The present disclosure relates to chassis electrical leakage path detection systems in vehicles.

BACKGROUND

Conventional electric vehicles may be equipped with a high voltage traction battery for use as a primary source of power and an auxiliary battery for use in powering various electrical components. The high voltage traction battery is typically isolated from the vehicle chassis. It is possible, however, to cause a short circuit between the traction battery and the body of the vehicle.

Certain previous works in detecting such resistive paths have involved deliberately providing a return path for current to flow through the resistive path into the vehicle chassis and back to the traction battery.

SUMMARY

A vehicle includes a battery pack, an electric motor, and a contactor configured to electrically connect the pack and motor. The vehicle also includes control circuitry for the contactor including a leak voltage detection sensor, and at least one controller programed to output a leakage resistance associated with a terminal of the pack based on a voltage of the pack and a leak voltage detected by the sensor while the contactor is closed.

A leakage path detection circuit includes a first circuit configured to detect a battery voltage of a traction battery in response to closing of a contactor circuit configured to electrically connect the battery and a motor. The first circuit includes an input terminal electrically connected with a first terminal of the battery, and a grounded output terminal electrically connected with a second terminal of the battery having a polarity opposite the first terminal. The leakage path detection circuit also includes a second circuit configured to detect a leak voltage associated with the battery in response to the closing of the contactor circuit. The second circuit includes an input terminal electrically connected with a contactor of the contactor circuit, and a grounded output terminal. The leakage path detection circuit further includes at least one controller configured to output a leakage resistance based on the battery voltage and the leak voltage.

A method for detecting battery leakage in a vehicle includes, in response to closing of a contactor configured to electrically connect a traction battery to a motor, outputting a resistance of a leakage path between the battery and a chassis of the vehicle based on a leakage current that flows through the contactor and to the chassis.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The embodiments of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programmed to perform any number of the functions as disclosed.

A hybrid vehicle may have a high voltage system having a traction battery pack. The traction battery pack is communicating to an electric load (e.g., electrical motor) through high voltage contactors. For example, there are at least two contactors that are installed on both ends (e.g., terminals) of the traction battery pack. The positive contactor connects to a negative end of the battery pack, while a negative contactor connects to a positive end of the battery pack. When the vehicle is not in use, the at least two contactors may be opened and isolate the battery system from the electric load. When the vehicle is in use, the contactors are closed and the battery system communicates to the electric load.

This disclosure proposes a method to estimate a leakage measurement (e.g., the electrical isolation) between the traction battery pack and a vehicle chassis. The leakage measurement method may use a monitoring circuit at the contactors and a voltage measurement algorithm. This method proposes several embodiments as shown in the figures below to estimate leakage resistance with the contactors. With the use of the existing monitoring circuit at the contactors, the method may not require an additional circuit (e.g., switches). The method may protect the battery from discharge when the vehicle is not in use because all contactors are opened and no additional circuits are needed, thus the leakage measurement circuit is isolated from the battery system.

Figure 1:
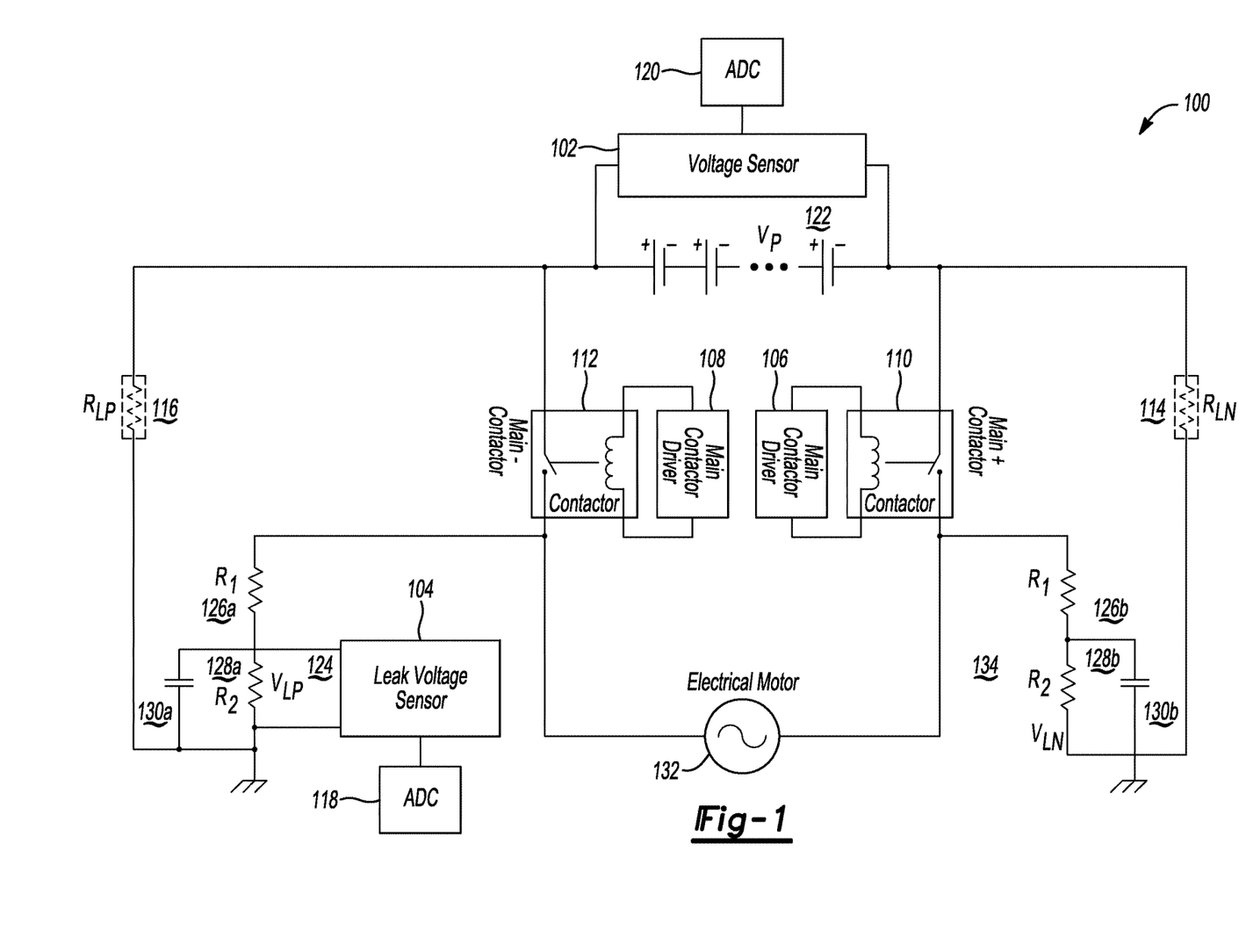
FIG. 1 is a schematic circuit diagram of a leakage path current detection circuit measuring a battery pack voltage and a positive leakage voltage.

FIG. 1 is a schematic circuit diagram 100 of a leakage path current detection sensor measuring a battery pack voltage and a positive leakage voltage of a high voltage system according to one embodiment. The circuit diagram 100 represents the high voltage system that may include a battery pack voltage sensor 102, a leak voltage sensor 104, a positive contactor driver 106, a negative contactor driver 108, a positive contactor 110, a negative contactor 112, an estimate model of positive leakage resistance 116 and an estimate model of negative leakage resistance 114. A vehicle computing system (not shown) may manage the high voltage system of the hybrid vehicle. The vehicle computing system may control the contactor driver 106, 108 and receive data from the battery pack voltage sensor 102 and leakage path current detection sensor 104. The vehicle computing system may comprise one or more control modules. The one or more control modules may include a battery energy control module (BECM). The BECM may receive data from the leakage path current detection sensor 104 via an analog to digital convertor 118. The BECM may receive data from the battery pack voltage sensor 102 via an analog to digital convertor 120.

The BECM may measure the battery pack voltage $V_p$ 122 via the voltage sensor 102 and a positive leakage voltage $V_{LP}$ 124 via the leak voltage sensor 104. The positive leakage voltage $V_{LP}$ 124 is measured by the leak voltage sensor 104. The positive leakage voltage $V_{LP}$ 124 is the voltage drop across resistor 128a. The leak voltage sensor 104 has a ground connection via a capacitor 130a.

If the main contactors 110, 112 are closed and the battery is being requested to power the electrical motor 132 for propulsion of the hybrid vehicle, the system may estimate the leakage resistance (i.e., leakage level) of the high voltage system based on a current flowing through the battery 122, the leakage detection resistors $R_1$ 126a 126b and $R_2$ 128a 128b, the positive leakage resistance $R_{LP}$ 116, and the negative leakage resistance $R_{LN}$ 114. The estimation of leakage resistance may be based on the following equation:

$$\frac{V_P(k)R_2 - V_{LP}(k)(R_1 + R_2)}{R_{LN}} + V_P(k)\frac{R_2}{(R_1 + R_2)} = \frac{V_{LP}(k)(R_1 + R_2)}{R_{LP}} + 2V_{LP}(k), k = 1, 2, \ldots, K \quad (1)$$

wherein $V_P(k)$ 122 is battery pack voltage at a $k^{th}$ sampling instant, $V_{LP}(k)$ 124 is leakage voltage at the positive side at the $k^{th}$ sampling instant, $R_{LN}$ 114 is leakage resistance to be estimated at the negative side, and $R_{LP}$ 116 is leakage resistance to be estimated at the positive side. The system may comprise the leakage detection resistors $R_1$ 126a 126b having the same resistance value. The leakage detection resistors $R_2$ 128a 128b may have the same resistance value. In one embodiment, the $R_1$ 126a 126b resistors may have a larger resistance value than the $R_2$ 128a 128b resistors. The equation may be used to calculate leakage resistance $R_{LN}$ and $R_{LP}$. The system may monitor whether a leakage current occurs based on the calculation in equation (1).

There are several methods to calculate leakage resistance $R_{LN}$ and $R_{LP}$ based on equation (1). For example, the system may implement a Least Mean Square (LMS) filter based on equation (1) to determine leakage resistance. The LMS filter may define the parameter matrix $A_1$, input matrix $X_1$, and output matrix $Y_1$ as shown in the following equations:

$$A_1 = \begin{bmatrix} a_{11} \\ a_{12} \end{bmatrix} = \begin{bmatrix} \frac{1}{R_{LN}} \\ \frac{1}{R_{LP}} \end{bmatrix} \quad (2)$$

wherein $A_1$ is a matrix value comprising $a_{11}$, which represents a fraction of $R_{LN}$ 114 leakage resistance at the negative side, and $a_{12}$, which represents a fraction of $R_{LP}$ 116 leakage resistance at the positive side, and $$X_1 = \begin{bmatrix} V_P(1)R_2 - V_{LP}(1)(R_1 + R_2) & -V_{LP}(1)(R_1 + R_2) \\ V_P(2)R_2 - V_{LP}(2)(R_1 + R_2) & -V_{LP}(2)(R_1 + R_2) \\ \vdots & \vdots \\ V_P(K)R_2 - V_{LP}(K)(R_1 + R_2) & -V_{LP}(K)(R_1 + R_2) \end{bmatrix} \quad (3)$$

wherein $X_1$ is a matrix comprising component values having known or measured values (e.g., $V_P$, $V_{LP}$, $R_1$ and $R_2$). The input matrix $X_1$ is based on the LMS method framework, and $$Y_1 = \begin{bmatrix} 2V_{LP}(1) - V_P(1)\frac{R_2}{(R_1 + R_2)} \\ 2V_{LP}(2) - V_P(2)\frac{R_2}{(R_1 + R_2)} \\ \vdots \\ 2V_{LP}(k) - V_P(k)\frac{R_2}{(R_1 + R_2)} \end{bmatrix} \quad (4)$$

wherein $Y_1$ is a matrix comprising component values having known or measured values (e.g., $V_P$, $V_{LP}$, $R_1$ and $R_2$). The output matrix $Y_1$ is based on the LMS method framework.

In response to the following variables calculated in equations 2, 3 and 4, the method may then reconfigure the equations based on the following equation:

$$Y_1 = X_1 \times A_1 \quad (5)$$

Based on equation 5 using LMS, $A_1$ is estimated in the following equation:

$$\hat{A}_1 \begin{bmatrix} \hat{a}_{11} \\ \hat{a}_{12} \end{bmatrix} = (X_1^T X_1)^{-1} X_1^T Y_1 \quad (6)$$

wherein the leakage resistance for the negative and positive sides of the high voltage system is based on the following equation:

$$R_{LN} = \frac{1}{\hat{a}_{11}}, R_{LP} = \frac{1}{\hat{a}_{12}} \quad (7)$$

Figure 2:
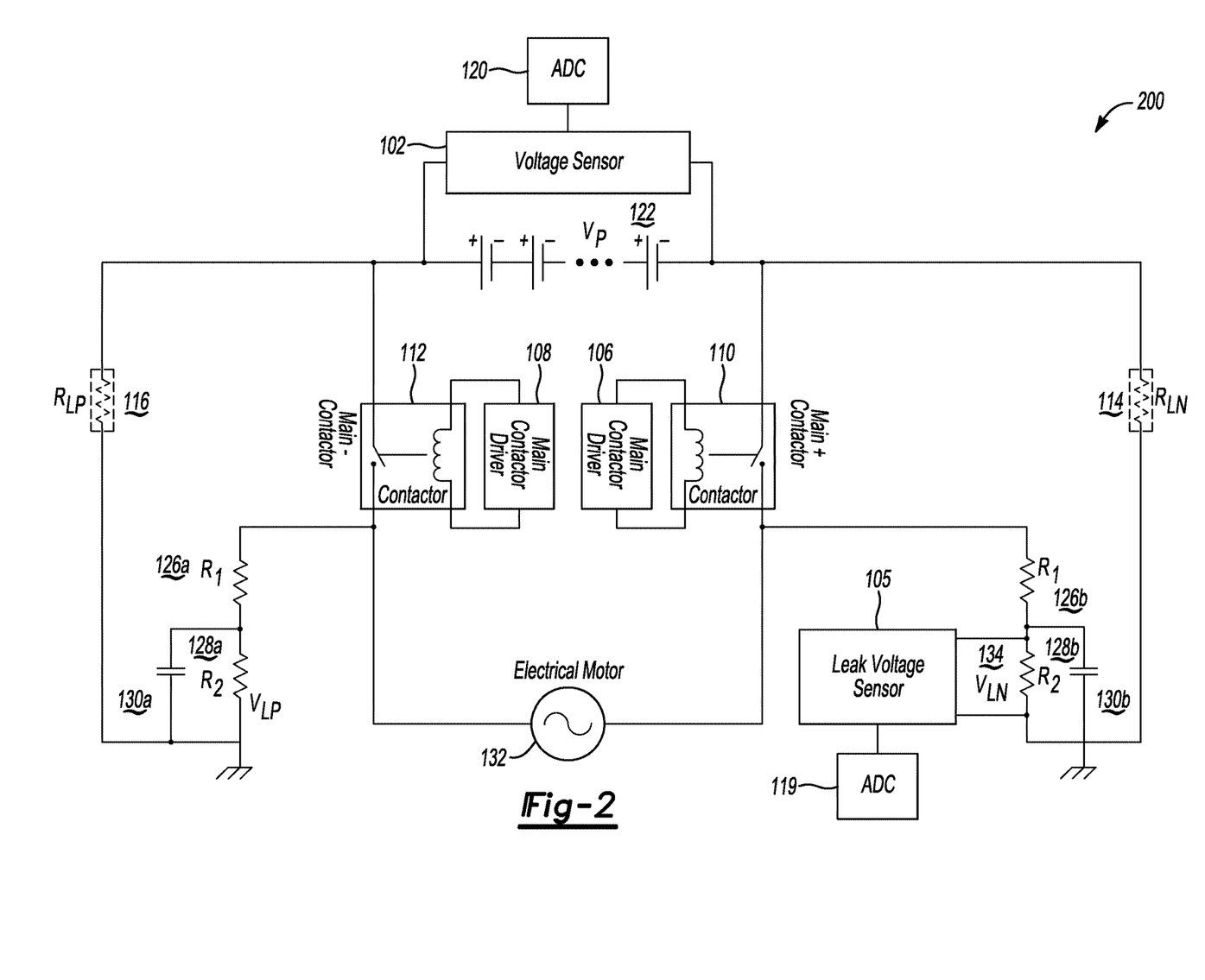
FIG. 2 is a schematic circuit diagram of a leakage path current detection circuit measuring a battery pack voltage and a negative leakage voltage.

FIG. 2 is a schematic circuit diagram 200 of a leakage path current detection sensor measuring the battery pack voltage and a negative leakage voltage of the high voltage system according to one embodiment. The circuit diagram 200 represents the high voltage system that may include the battery pack voltage sensor 102, a leak voltage sensor 105, the positive contactor driver 106, the negative contactor driver 108, the positive contactor 110, the negative contactor 112, the estimate model of the negative leakage resistance 114, and the estimate model of the positive leakage resistance 116. As stated above, the BECM may communicate and/or control the high voltage system. The BECM may receive data from the battery pack voltage sensor 102 via the analog to digital converter 120. The BECM may receive data from the leakage path current detection sensor 105 via an analog to digital converter 119.

The BECM may measure the battery pack voltage $V_p$ 122 via the voltage sensor 102 and the negative leakage voltage $V_{LN}$ 134 via the leak voltage sensor 105. The negative leakage voltage $V_{LN}$ 134 is measured by the leak voltage sensor 105. The negative leakage voltage $V_{LN}$ 134 is the voltage drop across resistor 128b. The leak voltage sensor 105 has a ground connection via a capacitor 130b.

If the main contactors 110, 112 are closed and the battery is being requested to power the electrical motor 132 for propulsion of the hybrid vehicle, the system may estimate the leakage resistance of the high voltage system based on a current flowing through the battery 122, the leakage detection resistors $R_1$ 126a 126b and $R_2$ 128a 128b, the positive leakage resistance $R_{LP}$ 116, and the negative leakage resistance $R_{LN}$ 114. The estimation of leakage resistance may be based on the following equation:

$$\frac{V_P(k)R_2 - V_{LN}(k)(R_1+R_2)}{R_{LP}} + V_P(k)\frac{R_2}{(R_1+R_2)} = \frac{V_{LN}(k)(R_1+R_2)}{R_{LN}} + 2V_{LN}(k), k=1, 2, \ldots, K \quad (8)$$

wherein $V_P(k)$ 122 is battery pack voltage at a $k^{th}$ sampling instant, $V_{LN}(k)$ 134 is leakage voltage at negative side at the $k^{th}$ sampling instant, $R_{LN}$ 114 is leakage resistance at the negative side, $R_{LP}$ 116 is leakage resistance at the positive side. The leakage detection resistors are $R_1$ 126a 126b resistor, and $R_2$ 128a 128b resistor. The equation may be used to calculate leakage resistance $R_{LN}$ and $R_{LP}$. The system may monitor whether a leakage current occurs based on the calculation in equation (8).

As mentioned above, several methods may be used to calculate leakage resistance based on equation (8) including, but not limited to, the LMS filter. The LMS filter may define the parameter matrix $A_2$, input matrix $X_2$, and output matrix $Y_2$ as shown in the following equations:

$$A_2 = \begin{bmatrix} a_{21} \\ A_{22} \end{bmatrix} = \begin{bmatrix} \frac{1}{R_{LP}} \\ \frac{1}{R_{LN}} \end{bmatrix} \quad (9)$$

wherein $A_2$ is a matrix value comprising $a_{21}$, which represents a fraction of $R_{LP}$ 116 leakage resistance at the positive side, and $a_{22}$, which represents a fraction of $R_{LN}$ 114 leakage resistance at the negative side, and $$X_2 = \begin{bmatrix} V_P(1)R_2 - V_{LN}(1)(R_1+R_2) & -V_{LN}(1)(R_1+R_2) \\ V_P(2)R_2 - V_{LN}(2)(R_1+R_2) & -V_{LN}(2)(R_1+R_2) \\ \vdots & \vdots \\ V_P(K)R_2 - V_{LN}(K)(R_1+R_2) & -V_{LN}(K)(R_1+R_2) \end{bmatrix} \quad (10)$$

wherein $X_2$ is a matrix comprising component values having known or measured values (e.g., $V_P$, $V_{LN}$, $R_1$ and $R_2$). The input matrix $X_2$ is based on the LMS method framework, $$Y_2 = \begin{bmatrix} 2V_{LN}(1) - V_P(1)\frac{R_2}{(R_1+R_2)} \\ 2V_{LN}(2) - V_P(2)\frac{R_2}{(R_1+R_2)} \\ \vdots \\ 2V_{LN}(K) - V_P(K)\frac{R_2}{(R_1+R_2)} \end{bmatrix} \quad (11)$$

wherein $Y_2$ is a matrix comprising component values having known or measured values (e.g. $V_P$, $V_{LN}$, $R_1$ and $R_2$). The output matrix $Y_2$ is based on the LMS method framework.

Based on the following variables calculated in equations 9, 10 and 11, the method may define the output matrix based on the following equation:

$$Y_2 = X_2 \times A_2 \quad (12)$$

In response to equation 12, using Least Mean Square (LMS), $A_2$ is estimated in the following equation:

$$\hat{A}_2 = \begin{bmatrix} \hat{a}_{21} \\ \hat{a}_{22} \end{bmatrix} = (X_2^T X_2)^{-1} X_2^T Y_2 \quad (13)$$

wherein the leakage resistance for the negative and positive sides of the high voltage system is based on the following equation:

$$R_{LN} = \frac{1}{\hat{a}_{22}}, R_{LP} = \frac{1}{\hat{a}_{22}} \quad (14)$$

Figure 3:
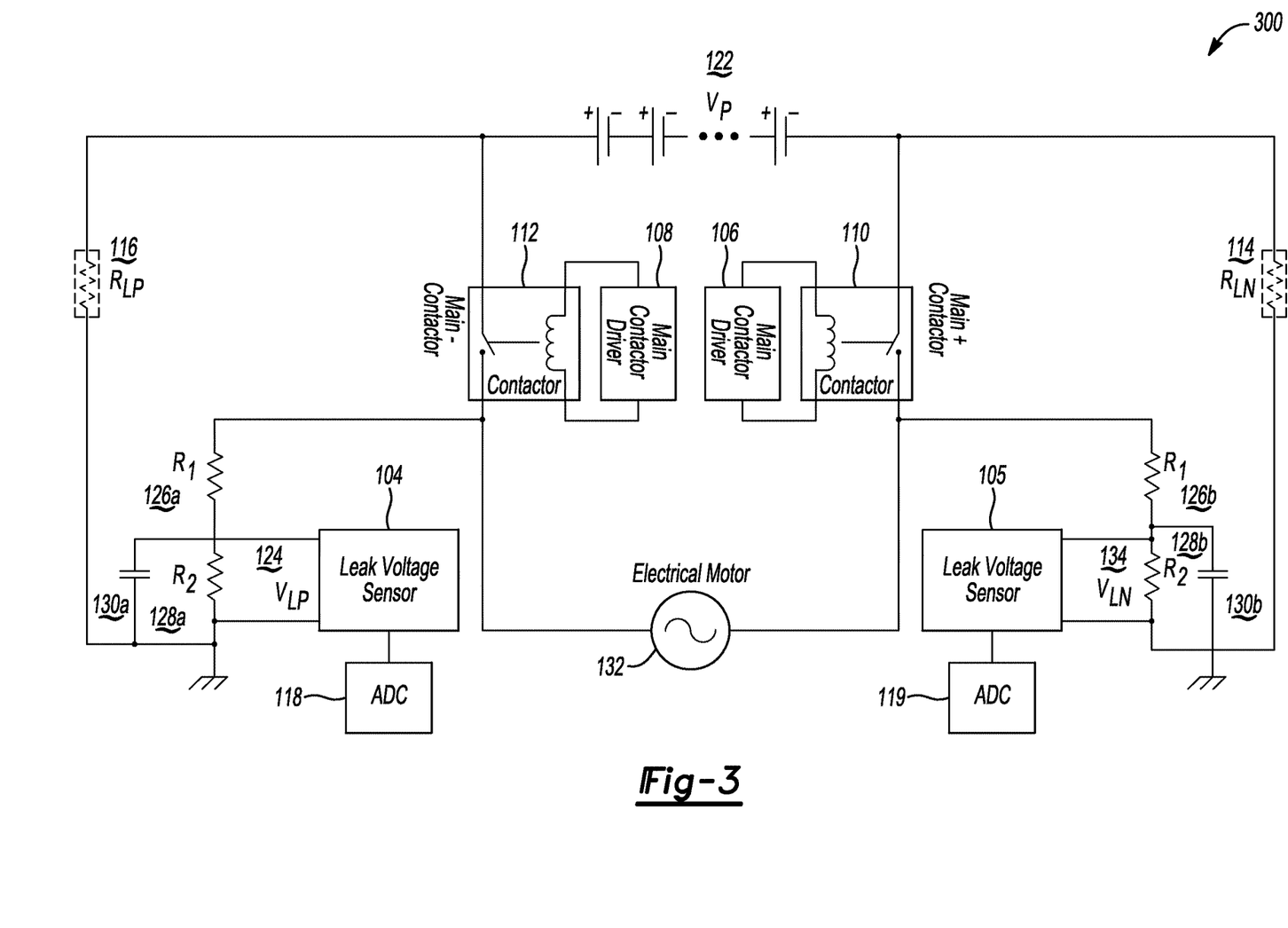
FIG. 3 is a schematic circuit diagram of a leakage path current detection circuit measuring the positive leakage voltage and the negative leakage voltage.

FIG. 3 is a schematic circuit diagram of a leakage path current detection circuit measuring the positive leakage voltage and the negative leakage voltage of the high voltage system according to one embodiment. The circuit diagram 300 represents the high voltage system that may include two leak voltage sensors 104, 105, the positive contactor driver 106, the negative contactor driver 108, the positive contactor 110, the negative contactor 112, the negative leakage resistance 114 and the positive leakage resistance 116. As stated above, the BECM may communicate and/or control the high voltage system. The BECM may receive data from the two leakage path current detection sensors 104, 105 via the analog to digital converters 118, 119.

The BECM may measure the positive leakage voltage $V_{LP}$ 124 and negative leakage voltage $V_{LN}$ 134 via the leak voltage sensors 104, 105. The positive leakage voltage $V_{LP}$ 124 is measured by the leak voltage sensor 104. The positive leakage voltage $V_{LP}$ 124 is the voltage drop across resistor 128a. The negative leakage voltage $V_{LN}$ 134 is measured by the leak voltage sensor 105. The negative leakage voltage $V_{LN}$ 134 is the voltage drop across resistor 128b. The leak voltage sensors 104, 105 have a ground connection via the capacitors 130a, 130b.

In FIG. 3, the BECM measures negative leakage voltage $V_{LN}$ and positive leakage voltage $V_{LP}$. If the main contactors 110, 112 are closed and the battery is being requested to power the electrical motor 132 for propulsion of the hybrid vehicle, the system may estimate the leakage resistance of the high voltage system based on current flowing through the battery 122, the leakage detection resistors $R_1$ 126a 126b and $R_2$ 128a 128b, the positive leakage resistance $R_{LP}$ 116 and the negative leakage resistance $R_{LN}$ 114. The estimation of leakage resistance may be based on the following equation:

$$\frac{V_{LN}(k)}{R_{LN}} - \frac{V_{LP}(k)}{R_{LP}} = \frac{V_{LP}(k) - V_{LN}(k)}{(R_1 + R_2)}, k = 1, 2, \ldots, K \tag{14}$$

wherein $V_{LN}$ 134 is leakage voltage at negative side, $V_{LP}$ 124 is leakage voltage at positive side, $R_{LN}$ 114 is leakage resistance at the negative side, $R_{LP}$ 116 is leakage resistance at the positive side, and the leakage detection resistors are $R_1$ 126a 126b and $R_2$ 128a 128b. The equation may be used to calculate leakage resistance $R_{LN}$ and $R_{LP}$. The system may monitor whether a leakage current occurs based on the calculation in equation (14). As stated above, the LMS filter is one of several methods to calculate leakage resistance based on equation (14). The LMS filter may define the parameter matrix $A_3$, input matrix $X_3$, and output matrix $Y_3$ as shown in the following equations:

$$A_3 = \begin{bmatrix} a_{31} \\ a_{32} \end{bmatrix} = \begin{bmatrix} \frac{1}{R_{LN}} \\ \frac{1}{R_{LP}} \end{bmatrix} \tag{15}$$

wherein $A_3$ is a matrix value comprising $a_{31}$, which represents a fraction of $R_{LP}$ 116 leakage resistance at the positive side, and $a_{32}$, which represents a fraction of $R_{LN}$ 114 leakage resistance at the negative side, and $$X_3 = \begin{bmatrix} V_{LN}(1) & -V_{LP}(1) \\ V_{LN}(2) & -V_{LP}(2) \\ \vdots & \vdots \\ V_{LN}(K) & -V_{LP}(K) \end{bmatrix} \tag{16}$$

wherein $X_3$ is a matrix comprising component values having a measured value (e.g., $V_{LP}$, $V_{LN}$). The input matrix $X_3$ is based on the LMS method framework, $$Y_3 = \frac{\begin{bmatrix} V_{LP}(1) - V_{LN}(1) \\ V_{LP}(2) - V_{LN}(2) \\ \vdots \\ V_{LP}(K) - V_{LN}(K) \end{bmatrix}}{(R_1 + R_2)} \tag{17}$$

wherein $Y_3$ is a matrix comprising component values having known or measured values (e.g. $V_{LP}$, $V_{LN}$, $R_1$ and $R_2$). The output matrix $Y_3$ is based on the LMS method framework.

Based on the following variables calculated in equations 15, 16, and 17, the method may define the output matrix based on the following equation:

$$Y_3 = X_3 \times A_3 \tag{18}$$

In response to equation 18, using the LMS, $A_3$ is estimated in the following equation:

$$\hat{A}_3 = \begin{bmatrix} \hat{a}_{31} \\ \hat{a}_{32} \end{bmatrix} = (X_3^T X_3)^{-1} X_3^T Y_3 \tag{19}$$

wherein the leakage resistance for the negative and positive sides of the high voltage system is based on the following equation:

$$R_{LN} = \frac{1}{\hat{a}_{31}}, R_{LP} = \frac{1}{\hat{a}_{32}} \tag{20}$$

The method and system to determine the leakage resistance may be estimated in real-time by using one or more algorithms such as a recursive least square algorithm. For example, the recursive least square algorithm may be used to estimate leakage resistance in the circuit configuration depicted in FIG. 3 based on the following equation:

$$\frac{V_{LN}(k)}{R_{LN}} - \frac{V_{LP}(k)}{R_{LP}} = \frac{V_{LP}(k) - V_{LN}(k)}{(R_1 + R_2)}, k = 1, 2, \ldots, K \tag{21}$$

The recursive least square algorithm may define the state to output matrix as the following equation:

$$H(k) = \begin{bmatrix} V_{LN}(k) \\ -V_{LP}(k) \end{bmatrix} \tag{22}$$

The recursive least square algorithm may define the state matrix as the following equation:

$$X(k) = \begin{bmatrix} x_1(k) \\ x_2(k) \end{bmatrix} = \begin{bmatrix} \frac{(R_1 + R_2)}{R_{LN}(k)} \\ \frac{(R_1 + R_2)}{R_{LP}(k)} \end{bmatrix} \tag{23}$$

The recursive least square algorithm may define the output as the following equation:

$$y(k) = V_{LP}(k) - V_{LN}(k) \tag{24}$$

In response to equations 22, 23, and 24, the method may define equation 21 based on the following equation:

$$y(k) = H(k)^T X(k) + e(k) \tag{25}$$

wherein the $e(k)$ represents the output measurement noise. Applying the recursive least square algorithm to equations (22)-(25), the $X_k$ may be evolved by using following equations:

$$X(k+1) = X(k) + K(k)(y(k) - H(k)^T X(k)) \tag{26}$$

$$K(k) = P(k-1)H(k)(H(k)^T P(k-1)H(k) + R)^{-1} \tag{27}$$

$$P(k)=(I-K(k)H(k)^T)P(k-1) \quad (28)$$

wherein the leakage resistance for the negative and positive sides of the high voltage system is based on the following equation:

$$R_{LN}(k) = \frac{(R_1 + R_2)}{x_1(k)}, R_{LP}(k) = \frac{(R_1 + R_2)}{x_2(k)} \quad (29)$$

In the recursive least square algorithm equation above, the initial values of P(k) and X(k) are P(0) and X(0), and parameter R may be predetermined. The output measurement noise covariance is $R=E(e(k)^2)$; the expected value of the initial state X(0) is X(0)=E(X), and the initial state estimation covariance is $P(0)=E[(X-X(0))(X-X(0))^T]$. Usually, P(0) is related to the prior knowledge about X. If there is no knowledge about X, let $P(0)=\infty \times I$; if there is prior knowledge about X, let P(0)=0.

The estimated leakage resistance may be very noisy, so a moving average filter is suggested to eliminate the noise from the leakage resistance calculation. In the filter, the parameter α may belong to [0, 1] as shown in the following equations:

$$R_{LP}{}^f(k)=\alpha R_{LP}(k)+(1-\alpha)R_{LP}{}^f(k-1) \quad (30)$$

$$R_{LN}{}^f(k)=\alpha R_{LN}(k)+(1-\alpha)R_{LN}{}^f(k-1) \quad (31)$$

The filters in equation (30) and (31) are low-pass filters which may improve the calculation of the estimated leakage resistance estimation for $R_{LP}$ and $R_{LN}$ by eliminating noise.

Figure 4:
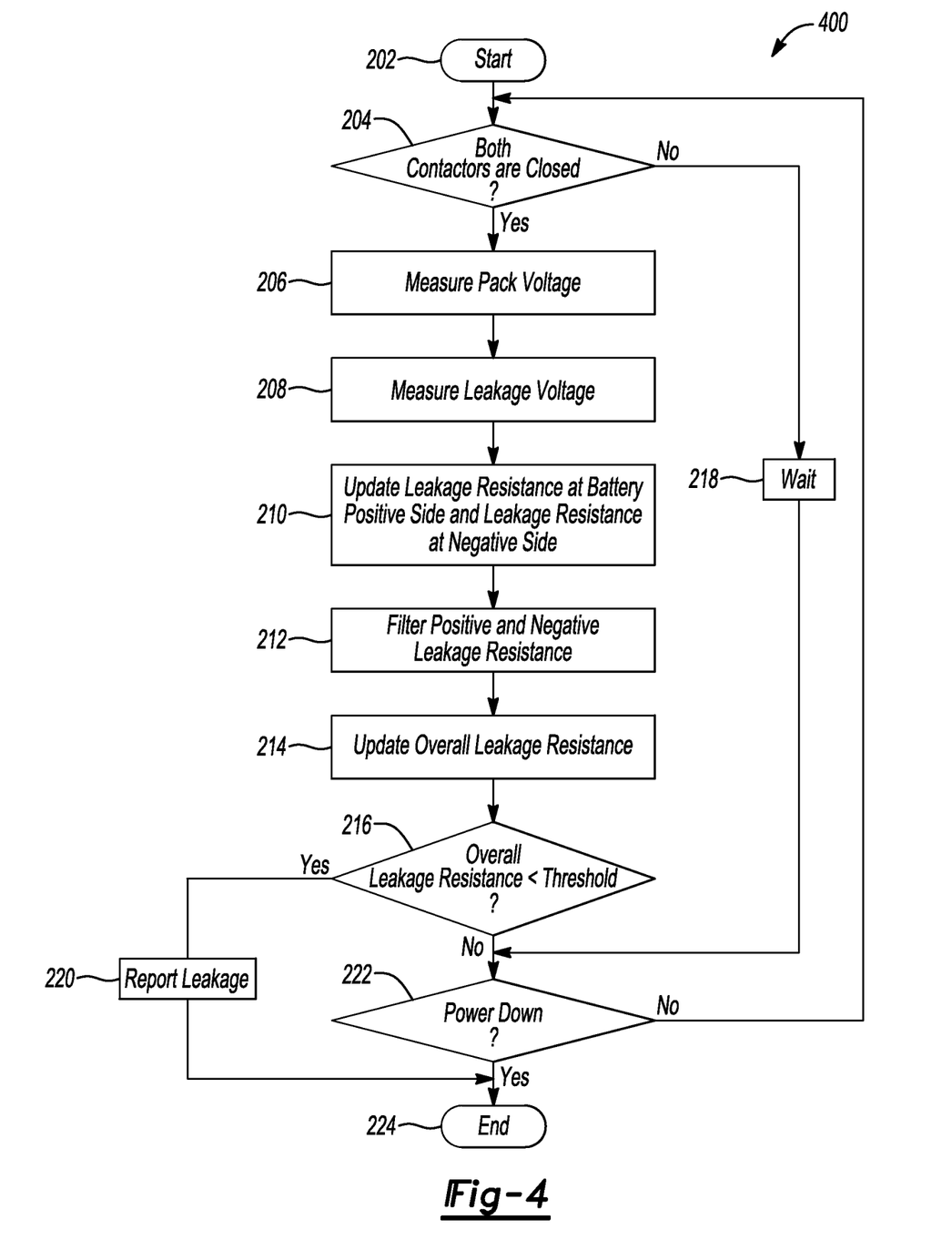
FIG. 4 is a flow chart illustrating an example method of estimating leakage resistance.

FIG. 4 is a flow chart illustrating an example method 400 of estimating leakage resistance in real-time according to an embodiment. The vehicle computing system may comprise one or more applications executed on hardware at the system. The vehicle computing system may comprise a processor (e.g., BECM) in communication with the voltage system. The one or more applications executed on the processor may include instructions to monitor leakage detection of the battery pack. The method 400 may be implemented using software code contained within the vehicle computing system and/or the voltage system. In other embodiments, the method 400 may be implemented in other vehicle controllers (e.g., processors), distributed amongst multiple vehicle controllers, and/or combination thereof.

Referring again to FIG. 4, the vehicle battery control system and its components illustrated in FIG. 1, FIG. 2 and FIG. 3 are referenced throughout the discussion of the method 400 to facilitate understanding of various aspects of the present disclosure. The method 400 of monitoring a leakage from the traction battery system may be implemented through a computer algorithm, machine executable code, or software instructions programmed into a suitable programmable logic device(s) of the vehicle and/or charging station, such as the vehicle control module, BECM, another controller in communication with the vehicle computing system, or a combination thereof. Although the various operations shown in the flowchart diagram 400 appear to occur in a chronological sequence, at least some of the operations may occur in a different order, and some operations may be performed concurrently or not at all.

In operation 202, during a key-on event which allows the vehicle to be powered on, the vehicle computing system may begin powering up the one or more modules. The powering up of the one or more modules may cause variables related to the high voltage system to initialize before enabling one or more algorithms used to monitor the battery.

In operation 204, the method may determine if both contactors are closed at the high voltage battery. If the contactors are closed, the method may measure the battery pack voltage in operation 206 via the battery pack voltage sensor. If the contactors are open, the method may be in a wait state for a predefined amount of time before checking to see if the high voltage battery is enabled in operation 218.

In operation 208, in response to the closed contactors, the method may measure the leakage voltage via the leak voltage sensor. The method may update the leakage resistance at the battery positive side, and/or at the battery negative side in operation 210. For example the configuration shown in FIG. 1 and described in equations (2)-(6) enables the system to monitor the leakage resistances using equation (7).

In operation 212, the method may filter the positive and negative leakage resistance using a filter and/or a moving average filter (e.g., Kalman filter). For example, a low-pass filter similar to equation (30) or (31) may obtain an improved overall leakage resistance value by eliminating the noise from the system.

In operation 214, the method may update the overall leakage resistance value based on the vehicle computing system measurement and calculation of the battery voltage, the one or more leakage voltage sensors, or a combination thereof. For example, the overall leakage resistance $R_{ALL}$ may be calculated by paralleling the estimated negative leakage resistance $R_{LN}$ and the estimated positive leakage resistance $R_{LP}$ (i.e., $R_{ALL}=R_{LN}*R_{LP}/(R_{LN}+R_{LP})$).

In operation 216, the method may determine if the overall leakage resistance is less than a predefined threshold value. The threshold value may be determined through hazard analysis done during development of the battery control system. If the overall leakage is less than the threshold, the vehicle computing system may report leakage and take some remedial actions. For example, the vehicle computing system may enable a message (e.g., send message to illuminate a lamp on an instrument panel) to inform customer of anomaly. In another example, if the overall leakage resistance is less than the predefined threshold value, the vehicle computing system may shut down the vehicle and prohibit use of the vehicle. If the overall leakage is greater than the threshold value, the method may continue to monitor the system.

In operation 222, if the method detects a key-off event, the method may end the one or more algorithms used to manage the battery pack and/or the one or more battery cells. The vehicle computing system may have a vehicle key-off mode to allow the method to store one or more parameters in nonvolatile memory such that these parameters may be used by the system for the next key-on event in operation 224.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   a battery pack;
   an electric motor;
   a contactor configured to electrically connect the battery pack and motor;
   control circuitry for the contactor including a leak voltage detection sensor; and
   a controller programed to output a leakage resistance between the battery pack and a chassis of the vehicle based on a leak voltage detected by the sensor and corresponding to a leak current that flows through the contactor.

2. The vehicle of claim 1, wherein the controller is further programed to output an alert if the leakage resistance is less than a threshold value.

3. The vehicle of claim 1, wherein the sensor is associated with a positive terminal of the battery pack.

4. The vehicle of claim 1, wherein the sensor is associated with a negative terminal of the battery pack.

5. The vehicle of claim 1, wherein the controller is further programmed to filter data from the leak voltage detection sensor to reduce noise associated therewith.

6. A leakage path detection circuit comprising:
   a first circuit configured to detect a battery voltage of a traction battery in response to closing of a contactor circuit configured to electrically connect the traction battery and a motor, the first circuit including
      an input terminal electrically connected with a first terminal of the traction battery, and
      a grounded output terminal electrically connected with a second terminal of the traction battery having a polarity opposite the first terminal;
   a second circuit configured to detect a leak voltage associated with the traction battery and corresponding to a leak current that flows through the contactor circuit in response to the closing of the contactor circuit, the second circuit including
      an input terminal electrically connected with a contactor of the contactor circuit, and
      a grounded output terminal; and
   at least one controller configured to output a leakage resistance between the traction battery and a vehicle chassis based on the battery voltage and the leak voltage.

7. The leakage path detection circuit of claim 6, wherein the second circuit is associated with the first terminal of the traction battery and wherein the first terminal has a positive polarity.

8. The leakage path detection circuit of claim 6, wherein the second circuit is associated with the first terminal of the traction battery and wherein the first terminal has a negative polarity.

9. The leakage path detection circuit of claim 6, wherein the at least one controller is further configured to apply a filter to the leak voltage and battery voltage to reduce noise associated therewith.

10. The leakage path detection circuit of claim 6, wherein the at least one controller is further programmed to output an alert message if the leakage resistance is less than a threshold value.

11. A method for detecting battery leakage in a vehicle comprising:
    in response to closing of a contactor configured to electrically connect a traction battery to a motor, outputting a resistance of a leakage path between the traction battery and a chassis of the vehicle based on a leakage current that flows through the contactor and to the chassis.

12. The method of claim 11, wherein the leakage path is defined between a positive terminal of the traction battery and the chassis.

13. The method of claim 11, wherein the leakage path is defined between a negative terminal of the traction battery and the chassis.

14. The method of claim 11, wherein the leakage path is defined between a positive terminal of the traction battery and the chassis, and a negative terminal of the traction battery and the chassis.

15. The method of claim 11, further comprising in response to the resistance being less than a predefined threshold value, outputting an alert message.

* * * * *